United States Patent [19]

Budnik et al.

[11] Patent Number: 6,087,967
[45] Date of Patent: Jul. 11, 2000

[54] METHOD FOR GENERATING AND READING A COMPRESSED ALL EVENT TRACE FILE

[75] Inventors: John Budnik, New Paltz; John R. Krauss, Carmel, both of N.Y.

[73] Assignee: International Business Machines Corporation, Armonk, N.Y.

[21] Appl. No.: 09/146,106

[22] Filed: Sep. 3, 1998

[51] Int. Cl.[7] ............................... H03M 7/46; G06F 3/00
[52] U.S. Cl. .............................................. 341/63; 395/500
[58] Field of Search .......................... 341/63, 87; 364/194; 370/255; 345/202; 379/88.1; 395/114, 888, 500; 707/101

[56] References Cited

U.S. PATENT DOCUMENTS 5,327,361  7/1994  Long et al. ............................. 395/500

*Primary Examiner*—Brian Young
*Assistant Examiner*—Patrick Wamsley
*Attorney, Agent, or Firm*—Pollock Vande Sande & Amernick

[57] ABSTRACT

A method for creating a file of compressed data representing trace events produced in a circuit simulation. The method creates first and second arrays of value changes for a facility being monitored, and the time of the changes. The first and second arrays of data are compressed by identifying any data forming a repeating pattern, by the pattern and an iteration count. Each of these arrays have a common index, representing the position data for a facility as changed. Facility names are also compressed using a hashing algorithm which stores an index based on the hash result. The reproduction of the compressed data occurs without expanding the entire data file, by locating stored data by the facility name index which points to the position in the file of the stored facility data. The data is reviewed based on an inquiry which selects particular time intervals, which may be retrieved from the file along with the related values.

9 Claims, 8 Drawing Sheets

Hash Table

| index | |
|---|---|
| 44 | 11 |
| ⋮ | |
| 77 | 12 |
| ⋮ | |
| 88 | 13 |
| ⋮ | |
| 99 | 14 |

Facility Table

| index | Collision Chain | Next Level | Name | Control Block |
|---|---|---|---|---|
| 11 | −1 | 12 | "CLOCK" | 20 |
| 12 | −1 | 13 | "HU" | — |
| 13 | −1 | 14 | "EFG" | — |
| 14 | −1 | −1 | "ABCD" | — |

FIG. 2

Start
|
Hash name to get hashIndex ─╱¯130
|
Get offset to collision chain from hash table at ─╱¯131
   hashIndex. Collision chain ends at the offset
   prior to that pointed to by the has table at
   hashIndex+1
|
Loop through collision chain until the desired name ─╱¯132
is found or the end of the collision chain occurs.
|                                                    ╱¯133
Was the name found ─ No ─▶ End ─╱
|Yes
|
|                                             ╱¯134
Store location of this entry in structure ─╱
|                                            ╱¯135
Read in data list and store in structure ─╱
|                                                ╱¯136
Pass pointer to structure to calling program ─╱
|
End

FIG. 6

METHOD FOR GENERATING AND READING A COMPRESSED ALL EVENT TRACE FILE

BACKGROUND OF THE INVENTION

The present invention relates to the electronic circuit simulation art. Specifically, a method is described for compressing the event trace information which is generated during the simulation of an electronic circuit.

Circuit design verification is utilized by logic design engineers to test an electronic circuit design before it is reduced to a silicon device. The circuit designer creates functional logic which may be modeled so that various circuit stimuli may be applied to the circuit while monitoring and recording the circuit response. The simulation of functional logic may be done on a time basis, such as clock cycle by clock cycle, which permits observation of the functional logic over time.

The simulators which operate on a clock cycle basis usually employ a debug capability. The debugging tools that accompany circuit simulation equipment include a scope function which permits the designer to see the changing values during any cycle of the simulation. During simulation, a file may be created identifying the events which take place for each clock cycle. Events represent a change in value of a given facility. Each observed event in the simulation, representing a change in value for the facility, is recorded along with its value for each clock cycle to create a historical record of all events which is used in evaluating and debugging the functional logic.

The debugging tools are capable of specifying a particular facility, and clock cycle which may be of interest for analysis. The tool permits the analysis of the value of the faults for the selected clock cycle facilitating debugging of the functional logic which has been simulated.

The all events trace file may contain data for greater than 1 million facilities for hundreds of thousands of different clock cycles. The size of the resulting all events trace file will typically require several hundred megabytes of DASD space for storage. The sheer size of the all events trace (AET) file necessarily means that access to a facility value of a clock cycle is slow. Thus, it would be desirable to not only reduce the size of the AET file, but to maintain a high degree of access to the reduced AET file.

The reduction of the size of an AET file is accomplished using various compression utilities which compress the data once it is generated by the simulator. When using the debugging tools, the data is uncompressed and made available for the debugging tool. The compression of the AET file considerable reduces the amount of the storage space required for the file, however, it dramatically increases the time to store and access the data, slowing down the simulation and debugging process.

Optimization of the AET format reduces the storage requirements by eliminating unnecessary data. Since time and facility values need the most amount of storage, the time or clock cycle number is only kept when a value has changed for any facility in the AET file.

A change mask locates values of facilities that change, so that only changed values get stored, further cutting down on the size of the AET file.

While the foregoing does reduce the size of the AET file, access time suffers in that to locate the value of a given facility at a given time or clock cycle, the entire AET file has to be traversed, essentially recreating the uncompressed file.

It is even possible, given the distribution of changes in values of a facility throughout an AET, that the resulting AET may be larger than the original AET.

The foregoing disadvantages are addressed by a method in accordance with the invention.

SUMMARY OF THE INVENTION

It is an object of the invention to compress an AET file without a loss of simulation efficiency, loss in speed of creation of the AET file or a loss in access speed.

It is an object of this invention to compress an AET file into a format which can be read without a corresponding decompression process.

These and other objects of the invention are provided by a compression method which comprises the facilities data produced in a simulation. The AET file values for each facility and the time of each value are separately compressed and related by an index value. By compressing the times and values separately, the data may be recovered in the uncompressed state without decompressing the entire data file.

The time of each clock cycle can be compressed by storing the deltas representing a time interval between changes in value. Compression of time occurs by creating an array of deltas representing the number of clock cycles between changes in a facility value. If the array of deltas form a repetitive pattern they are compressed by replacing the repetitions of the pattern with an iteration count.

The facilities values for each of the deltas may be stored in a second array and compressed independently of time. An initial facility value is stored, and an array of subsequent values representing changes in the facility value for each delta is created. If a pattern results from the stored values which is repetitive, the repetition is represented as an iteration count. Thus, rather than repeating the repetitive values, the basic pattern and an iteration count is stored in the array.

Additional compression of the AET file is obtained by compressing facility names. Since the names are hierarchial with a base name followed by a series of qualifiers, compression is achieved by storing the lowest level of the name in a facility table location identified by the hashed value of the full name. The identified location includes a pointer to a control block which contains the location of the time/value data for the facility, and a pointer to a location of the next qualifier of the name, which in turn contains a pointer to the next location containing a subsequent qualifier. During a debug operation, the location of the time/value data for a facility is obtained by hashing the facility name and locating from the hash value the location of the control block containing the data. Since different facility names may produce the same hash value, the location in the facility table containing the control block is verified by rebuilding the name from the qualifiers which are pointed to by the facility table, and comparing the rebuilt name with the full facility name. Once the name has been verified, the full name may be written to the facility table location containing the control block location for future reference.

DESCRIPTION OF THE DRAWINGS

FIG. 2 represents the process of compressing a facility name using a hashing algorithm;

FIG. 6 shows the process for obtaining a specified facility identified from a hash index stored in the AET file;

DETAILED DESCRIPTION OF THE PREFERRED EMBODIMENT

Design verification for integrated circuits is performed by logic design engineers in order to establish the functionality of a circuit design before it is reduced to silicon. The design verification process may typically utilize a computer simulation of the circuit design to verify functional logic and physical dependencies of the system. Large scale integrated circuit designs are typically implemented in hierarchies, and the simulation determines the signal conditions on upwards to 1,000,000 elements, or facilities designed in the circuit.

Figure 1:
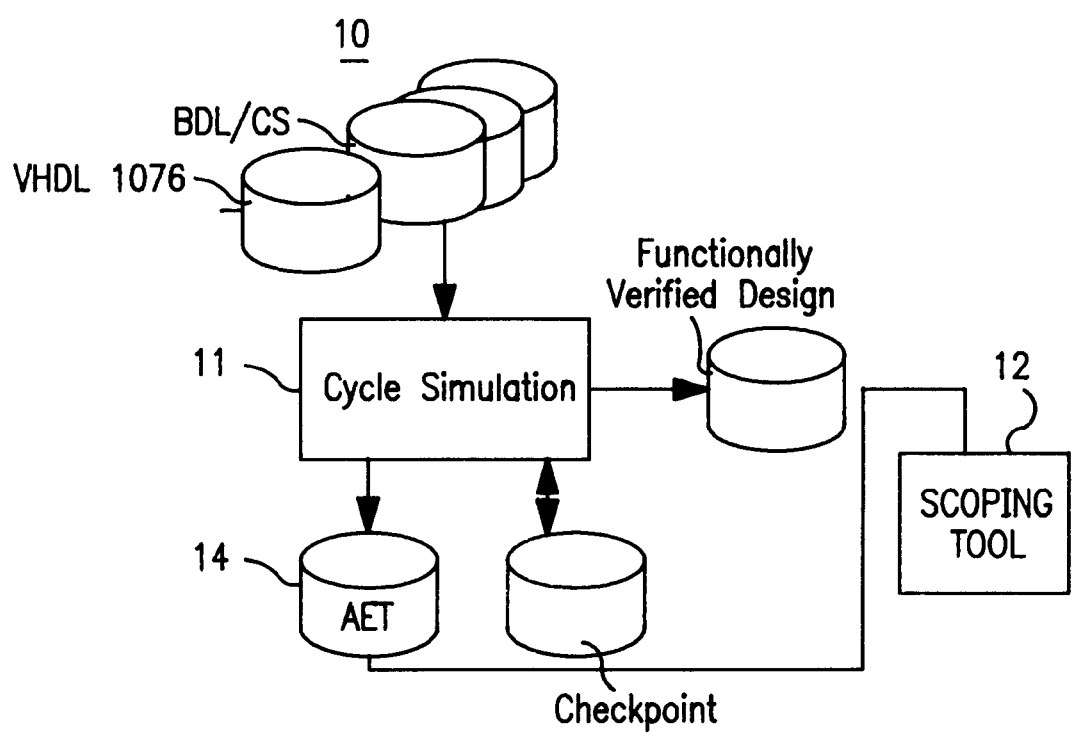
FIG. 1 illustrates a system which simulates a circuit design.

FIG. 1 shows how the functional logic, reduced to a computer file VHDL 10 is simulated by a simulator 11 having a scoping tool 12 which permits the location of a signal value on any of the up to 1,000,000 circuit elements, i.e., facilities, within the design.

A typical interval for collecting such signal values is a clock interval for the digital devices. The upwards to 1,000,000 facilities generate signal events during the clock interval representing a historical performance of the simulated circuit. The data is stored in an all events trace (AET) file 14 which permits a circuit designer to view the progress of the simulation, and determine whether or not errors in the functional design or its physical implementation exist.

Complex integrated circuits having upwards of 1,000,000 elements, or facilities, may be monitored over tens of thousands of clock cycles, making the AET file large. Compression of the AET file reduces the size of the file reducing the DASD space needed to store the file. However, care must be taken in the use of compression algorithms to avoid incurring excessive delays in decompressing the data when accessed by the designers during a debugging operation.

The present invention provides for the compression of the AET file in a way which does not unduly limit access time for recreating the fully expanded data file.

The basis of the preferred embodiment of the present invention provides for compression of not only data values associated with each facility monitored during the simulation, but also compression of the facility names which are generally hierarchical in nature, representing the hierarchical nature of the design. The hierarchical name includes a base name and a series of qualifiers. The facility name is hashed such that an index value is obtained which is recorded in the AET file in place of the facility name. When the AET file is read, the index is used to reconstruct the full name of the facility and locate the related data for presentation during the debugging operation.

The compression of facility values by the simulation system employs two significant data reduction features. The first is that data values are accumulated over time, with only changes in the data values being recorded with the corresponding time of change. The resulting array of data value changes and times of the changes can be further reduced by the second feature of compression.

The second feature of compression provides for reducing the array of changed values as well as the times of these changes by representing patterns of the data with an iteration count. Thus, for a given facility, such as a clock, latch, or other basic logic function, much of the time/value data is repetitive in nature, and instead of recording each time the value changes in the AET file, an iteration counter may be employed in the array, which identifies a pattern of time changes and the number of times the pattern repeats.

The concept of using patterns and iteration counts to represent data is used to represent the time of occurrence of a value change, as well as the change of facility values on an independent basis. Using a common index between the time and value arrays, it is possible to locate the value at any particular time of a simulation operation. An example of the compression of a facility value over time is given below, where for a given facility, a first array is produced of values, representing the changes in a value over time, and a second array representing the time of the changes.

Example of algorithm showing both time and values

Given the following group of time/value pairs this example shows how they would be stored and compressed.

double initialTime=0;
| time | 0 | 3 | 4 | 5 | ... | 30 | 50 | 51 |
|---|---|---|---|---|---|---|---|---|
| value | x | 0 | 1 | 0 | ... | 1 | 0 | 1 |

At time 0, a 0 is entered into the first element of the time array, and the value of x is entered into the first element of the value array.

| time | ¦0000¦ |
|---|---|
| value | ¦x¦ |

The above array shows that an initial (start) value of x and start time of 0 are obtained during the simulation. The value does not change until three clock cycles, or a delta of three, in which case it goes to 0. During the fourth clock cycle, the value changes to 1. During the fifth to 0, and its repeats in a 01 pattern for each time, or delta, until time 30 is reached, at which time it remains at 1 until time 50. At time 51 it changes again to 1.

The number of data points contained in the above array, which is considerably less than an actual simulation, can be reduced significantly using the compression in accordance with the preferred embodiment. The compression of the time and value arrays is begin by considering the first two time elements and value elements as follows:

At time 3 a delta of 3 (time 3–time 0=delta 3) is entered into the second element of the time array and the value of 0 is entered into the second element of the value array.

| time | ¦0000¦0003¦ |
|---|---|
| value | ¦x¦0¦ |

Building out the array further, representing time as an interval between the preceding time, so that time 4 is actually represented by a delta or change of 1 from the preceding time, the array is as follows:

The delta 1 is entered into the next time element and the changed value of 1 is entered in the value arrays . . . .

| | |
|---|---|
| time | \|0000\|0003\|0001\| |
| value | \|x\|0\|1\| |

At this point, the array is built comprising only those instances of time where a value has changed. This produces potential matching patterns which can be reduced to a basic pattern and an iteration count identifying the number of times that the basic pattern is replicated. Continuing with building the array, from the raw data, the following array is obtained which illustrates the repetitive nature of the data.

Both the time and the value arrays are checked for matching patterns array elements 0 and 1 against 2 and 3, no match is found.

| | |
|---|---|
| time | \|0000\|0003\|0001\|0001\| |
| value | \|x\|0\|1\|0\| |

At time 6, the array begins to show a pattern in the value array. The array, up to time 6, is represented as follows:

| | |
|---|---|
| time | \|0000\|0003\|0001\|0001\|0001\| |
| value | \|x\|0\|1\|0\|1\| |
| compressed value | \|x\|0\|1\|32770\| |

Array elements 1 and 2 are compared to 3 and 4; no match for time, but value has a match, so elements 3 and 4 are used as an iteration count. The count reads 2, the hi bit is turned on to flag it as an iteration count.

The pattern 0¦1 has repeated twice in the value array, and therefore, rather than replicating the pattern two times, the array may be simplified by representing the pattern once, with an iteration count following. The iteration count, however, must be distinguished from data when reading back the AET. Accordingly, a flag is used to represent an iteration count, followed by the actual count. By using this technique, the iteration count may be represented by 1000000000000010, where the most significant bit is the flag, distinguishing the count from actual value data. This binary number, for explanation purposes, can be reduced to the hex number 8002, or the decimal number 32770 shown in the above value array.

The array can be continually built, by inserting the remaining values as shown below, which goes out to the fifth time array entry shown below.

Now the time array can compress and the value array just adds on the end.

| | |
|---|---|
| time | \|0000\|0003\|0001\|0001\|0001\|0001\| |
| time | \|0000\|0003\|0001\|0001\|32770\| |
| compressed value | \|x\|0\|1\|32770\|0\| |

In the above, it is clear that time has a repeating pattern of 0001, following the second entry, and therefore an iteration count is also placed in the time array along with the pattern 0001,0001 to avoid using memory space to store the repeating common pattern.

Time gets added to the end and the value now has a pair which it can compare. Elements 1 and 2 match the last two elements so the iteration is incremented.

| | |
|---|---|
| time | \|0000\|0003\|0001\|0001\|32770\|0001\| |
| compressed value | \|x\|0\|1\|32770\|0\|1\| |
| compressed value | \|x\|0\|1\|32771\| |

Continuing to build the array, using the foregoing compression technique, yields further matches, and further compression. As the following thirteen values of time are also represented by a single delta value of 1, the time pattern out to 30 can be represented by eleven more pairs of deltas which equal 1. Accordingly, the iteration count represents a value of 13, when shown as decimal value 32781 (wherein the highest order bit of the binary equivalent number has been set to 1, representing iteration count). Following time 30, the values of the original data do not change until 50, and therefore the delta of 20 is inserted in the time array, to identify the next change. Further, the time array is augmented by 1 more delta, representing the change in values that occur between 50 and 51.

| | |
|---|---|
| time | \|0000\|0003\|0001\|0001\|32781\|0020\|0001\| |
| value | \|x\|0\|1\|32783\| |

Additionally, as there has been a continuous 0 1 pattern represented in the value array, this pattern may be extended to the end of the data with an iteration count of 32783, a decimal representation of the binary number 1000000000001101. The foregoing example shows how 51 different values for a monitored facility may be reduced to three values, and an iteration count. Further, the time array has been reduced from 51 separate clock times to 6 and an iteration count.

The level of compression is obtained without a significant expense in decompression time. Expansion of the data is intuitively shown upon reviewing the compression result obtained above.

Expanding out the value array is simply a matter of repeating patterns identified by the iteration count. Similarly, in expanding out the time array each array element represents a time in which data in the value array changed, and can be read directly from the array. When an iteration count is observed, the previous two deltas represent a pattern which is repeated for the number of times indicated by the iteration count. In one embodiment of the invention the initial start time and start values are stored in a respective data list instead of the actual array.

The present invention also takes into account the need to compress up to a million facility names for which values are recorded over time. The compression of facility names also provides more efficient use of DASD space, and in accordance with the present invention facility names are stored in a manner which assists in deriving the design hierarchial structure.

The basis for compressing facility names is through a hash algorithm, which reduces the facility name to a set of index digits. By hashing the name, then stripping off the lowest level qualifier of the name, individual hierarchial levels which may employ a common portion of the facility name are efficiently encoded as indexes derived from a hash table.

Referring now to FIG. 2, an example of the hashing process applied to a facility name, such as ABCD.EFG.HIJ.CLOCK is shown. The name has a hierarchial structure, as the integrated circuit is designed in hierarchies, whereby there may be tens of thousands of clock signals associated with different levels within the hierarchy. The full name is initially hashed, and a hash index is derived which may be, for instance, 44. The next empty facility table index is used, such as 11, and the hash table entry 44 is set to 11. Thus, it may be possible in the AET file to represent the facility by an index value 11.

The name field in the facility table points to the lowest qualifier, which is CLOCK. The hashing process is repeated for each of the other qualifiers, ABCD.EFG.HIJ, and its lowest level is stripped off and the process repeated recursively. An index of 77 is obtained for the next level, and the hash table entry 77 is stored with a new index value 12, pointing to the next qualifier which was hashed. As set forth in FIG. 2, the process repeats until all levels of the hierarchy have been hashed.

Given the values of the indexes, it is possible to store with the AET data an index representing for the facility name a pointer to a control block locating time/value data for a given facility. As will be evident, the decompression of the index to produce a facility name can occur without a significant increase in decompression time.

The possibility of having two facility names hashing to the same value and thus erroneously identifying the same control block and time/value data is avoided by first reconstructing the full name from the facility table. When the time/value data for a facility is desired during a debug operation, the full name is rebuilt from the qualifiers identified by each pointer. Thus, index 11 identifies the qualifier contained in location 12, as "HIJ". the next qualifier is pointed as being contained in location 13 as "EFG" which in turn points to a qualifier in location 14 as "ABCD". The next level includes a notation −1 which indicates that the highest qualifier level has been reached. Thus the full name of ABCD.EFG.HIJ.CLOCK is obtained and compared with the facility name of interest. If they are the same then it is established that the control block identified by the pointer 20 is the correct control block containing the time/value data for the facility. Locations which contain only qualifiers do not reference a control block since they do not constitute a base term of a facility name.

Figure 8:
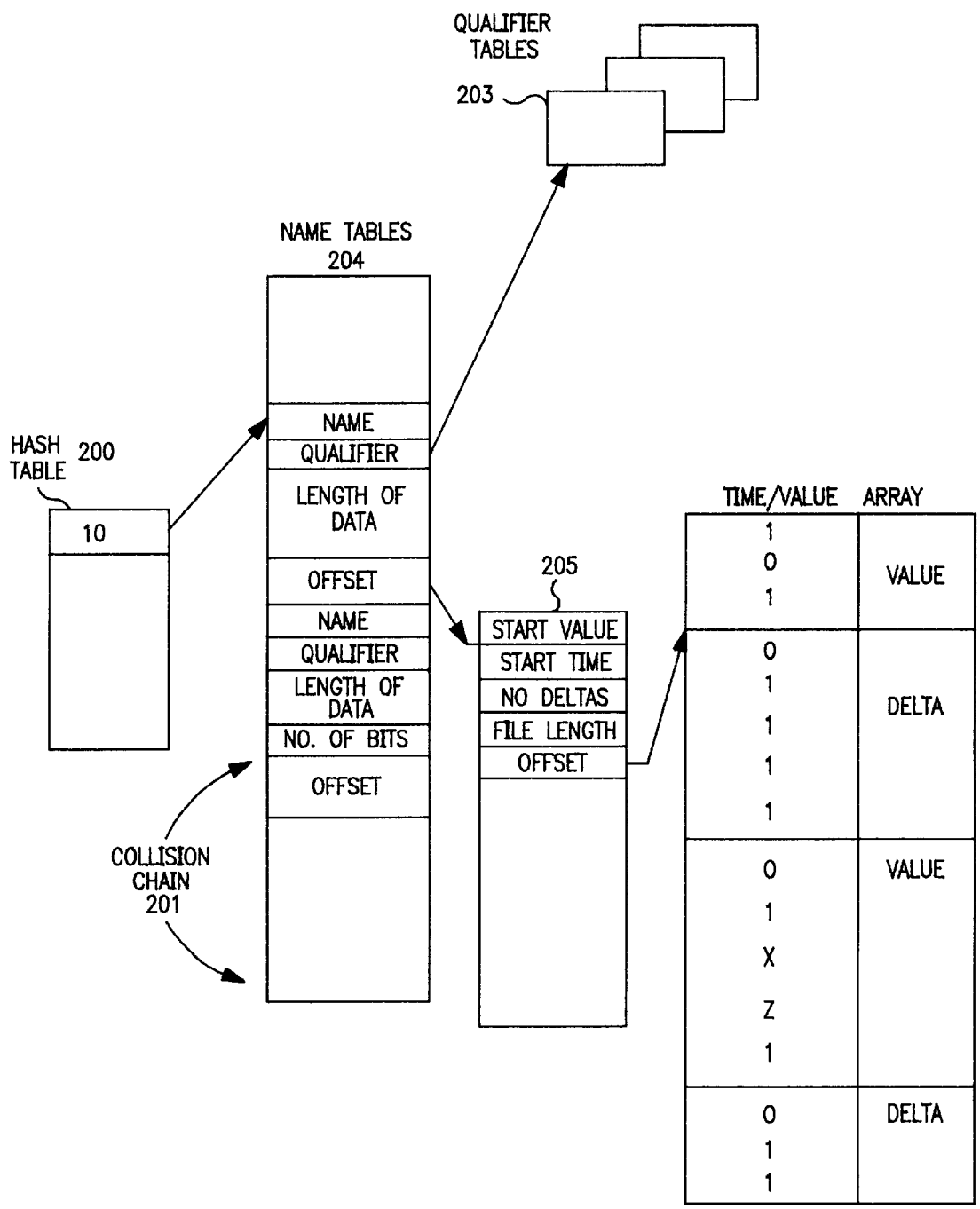
FIG. 8 illustrates the relationship between a hashed facility name and the time/value data.

FIG. 8 illustrates the process for locating AET data for a given facility name using the foregoing principle. During use of the scoping tool, a designer can select a particular facility and a time for which the value for the facility is to be analyzed. The hash table 200 includes an array of offsets to name tables 204. Once the name is hashed, the identity of a collision chain 201 may be determined, containing name tables 204 for a plurality of facilities. The name table as shown in FIG. 8 includes a qualifier, name, length of data, and offset to a data list. During the lookup process, the hash table index obtained from hashing the name provided by the scoping tool, points to the first name table of the collision chain 201.

The first name table is searched to identify an index to a name array. The index points to an index to the next qualifier associated with that name in qualifier table 203. If the next qualifier also matches the qualifier of the search quantity, the qualifier is returned and the index associated with it to obtain a subsequent qualifier. In this way, the name table can be quickly determined to be either the correct one within the collision list, or not if each qualifier produced does not match the qualifier for the searched facility name. If the first name table is deemed to correspond to the searched facility name, the offset data contained in the table points to a data list 205 identifying the location for the time value data.

The data list 205 for the identified facility is a control block which defines the location of the time (delta) and value arrays for the facility. A start time is included in the data list along with the number of deltas. The beginning position in the AET file containing the time and value arrays is identified by the file offset, as well as its length. The data list also contains the start time and start value for the facility at the beginning of the simulation.

The delta time table 209 is set up to accept two bytes for each array element, and each value table 210 element takes one byte. A full data list's length is 15, because of the five deltas at two bytes each, and five values at one byte each.

Thus, in response to a search request, it is possible to locate expeditiously the facility, which in turn identifies a data list which contains the file offset to show where the appropriate time and data values are kept.

Figure 3:
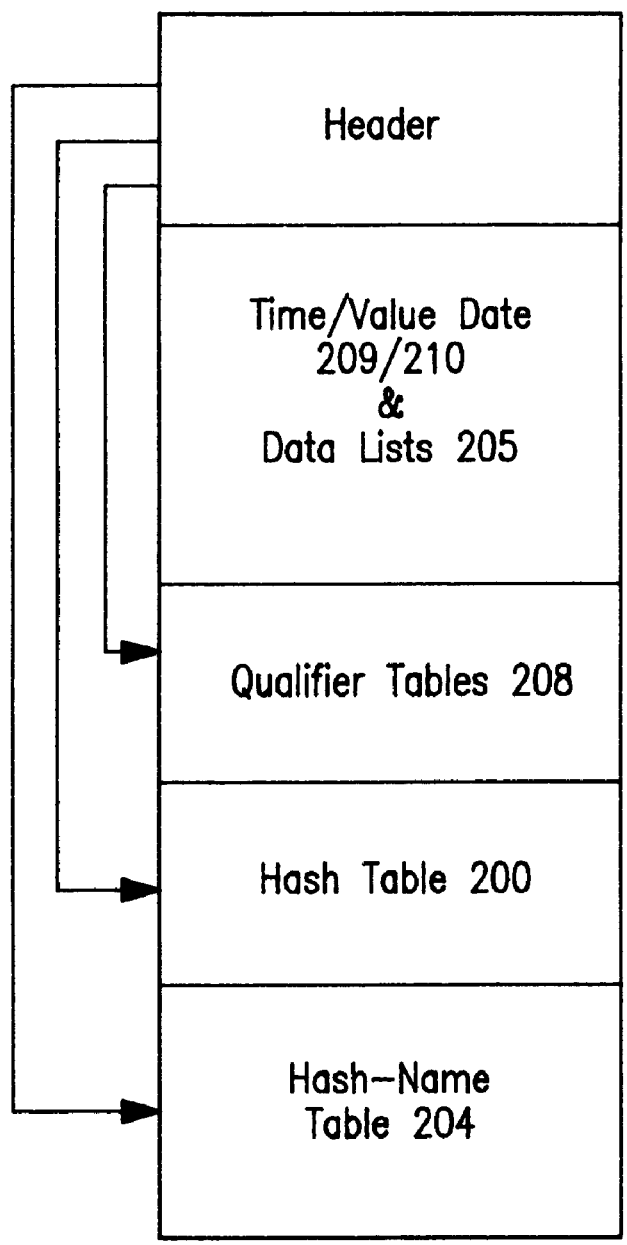
FIG. 3 represents the format of a compressed AET file in accordance with a preferred embodiment.

The general format of the AET file is shown in FIG. 3. Referring now to FIG. 3, a header is provided which contains offsets from the file for the qualifier table, name table and hash table. The header may also contain other information such as the time stamp, when the data was obtained, as well as a version number, etc.

The simulation process generates time/value data for a number of user specified facilities. The simulator calls AET routines, opening the AET, defining the size of facilities to be recorded in the AET, and then adds times/values for the facilities to the AET. The AET is closed once the simulation is complete.

To open an AET sufficient memory is reserved for the various tables, i.e., hash table, name tables, header, and the remaining portions of the AET file shown in FIG. 3. During the simulation, the simulator may add a facility to the list of facilities in which trace events are being kept.

Figure 4:
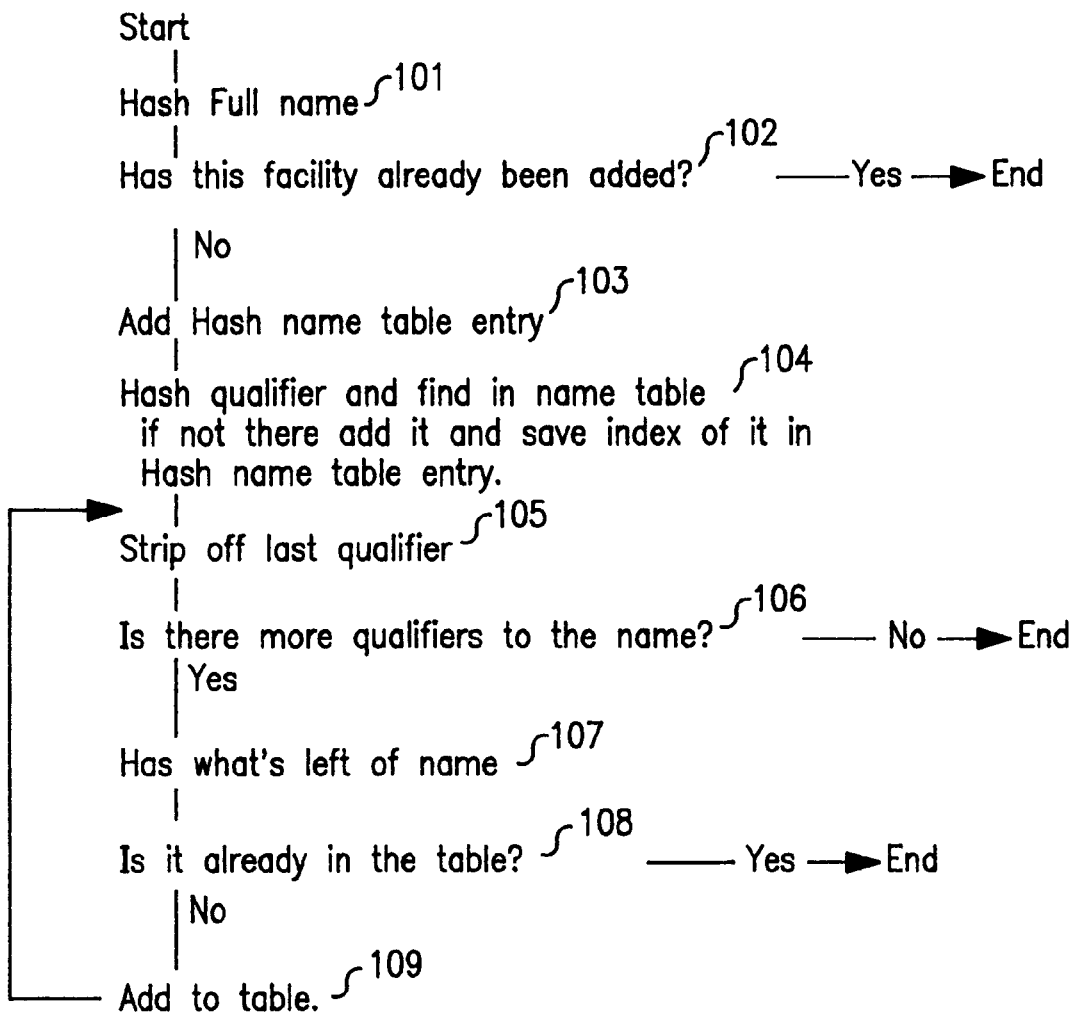
FIG. 4 illustrates the process for adding a facility to the AET file.

Referring now to FIG. 4, the process for adding a facility to the AET is shown. At the start, the full name of the facility is hashed in step 101. A determination is made in step 102 whether this facility name has already been added to the name table. If it is not in the name table, the hashed name is entered along with the respective index in step 103.

The last qualifier is removed and the remaining portion of the name is then hashed in step 104, and, if it is not found in a name table, it is added along with the respective index to the hash name table.

The name qualifiers are recursively hashed in steps 105–107, and checked against the current entries in the name table in step 108. The hashed value along with the qualifier is added to the name table in step 109.

Figure 5:
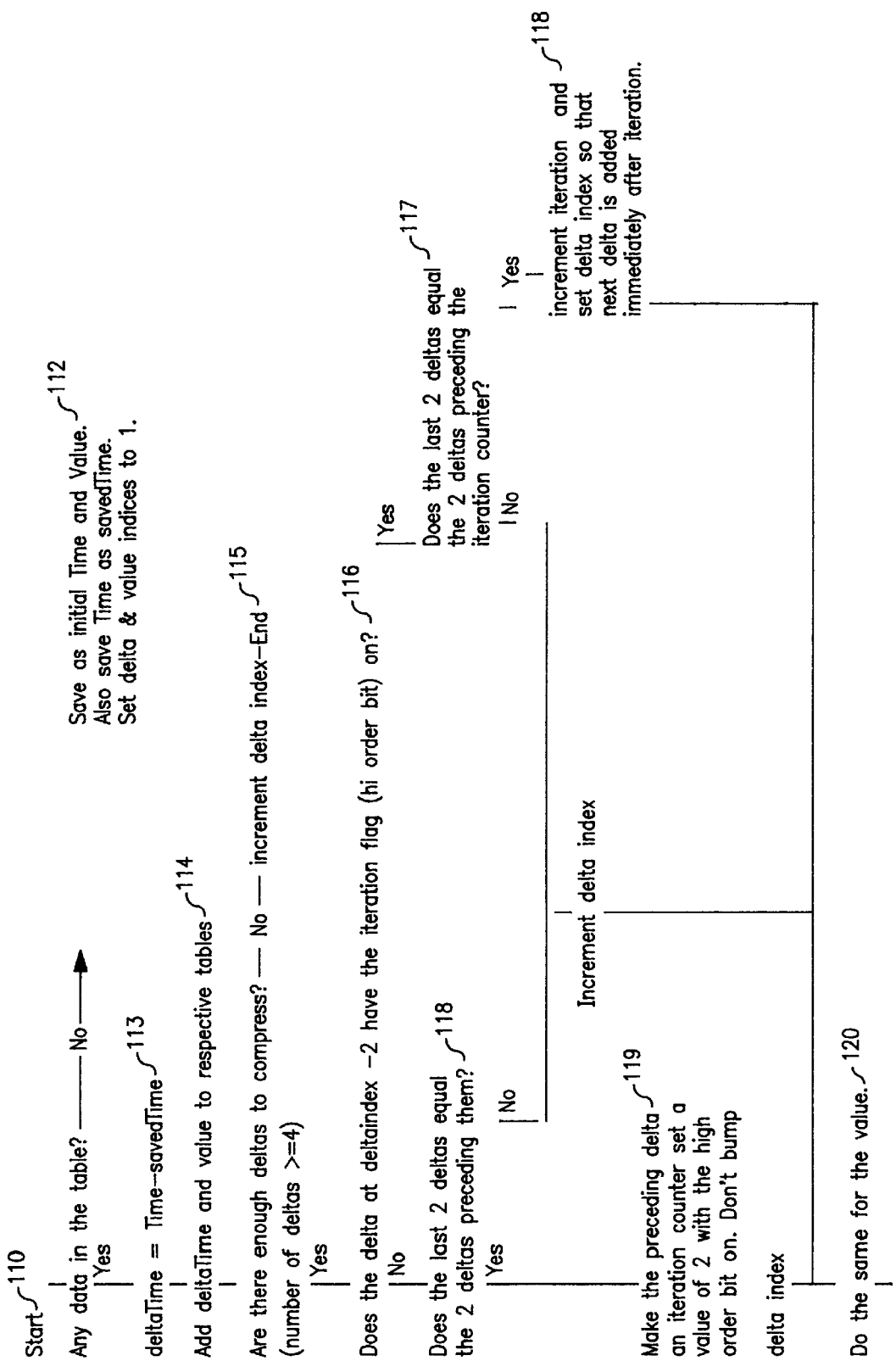
FIG. 5 illustrates the compression process for time value pairs generated during simulation.

Having now stored the required facility, the time value header for the facility can be stored in the AET file. As was noted with respect to the description of the compression to be utilized by the invention, time, in the form of deltas, i.e., the difference in time between the last occurrence of a changed value, are stored in one array, with the respective change in value in another array. The creation of the time and value compressed arrays is identical, and the process for effecting the compression is represented in FIG. 5.

The compression begins at the start input 110. If there has been no entries made to either array, the data is saved as an initial time and initial value. The deltas are then defined in step 113 as the time of the most recent change in the facility value minus the previous saved time. The time of a change in the facility value and the changed value are then stored in step 114 in each of the respective arrays. When there are four or more entries in each array as determined in step 115, the following tests are conducted on each of the arrays to determine the compressibility of the entries.

A determination is made in step 116 whether an iteration flag has been set for either of the arrays. If it hasn't, the last two entries are compared with the previous two entries in step 118, in order to determine whether a pattern exists. If the pattern exists, an iteration count is set equal to 2 in step 119, representing a match between the two pairs of entries.

As additional delta times and respective values are obtained from the simulator, they are checked in step with the preceding array pairs in steps 116–119, and the preceding iteration count in step 117. If they are equal, the iteration count is again incremented in step 118, and the next time value pairs are added to the respective arrays.

The time and value arrays are continuously updated in step 120, each time the value changes. When pairs of consecutive values form a pattern, an iteration count is substituted for the values, so that the values are not rewritten every time the pattern repeats, but are duplicated based on the iteration count.

Once simulation is ended the compressed time and value arrays are written to the AET. The time value compressed pairs for each facility are saved in DASD, and the offset for the time value pairs is stored in the AET data list. Name tables are created which link the hash values of the facility, to the data lists as will be described with respect to the process of reading the AET data. Hash tables contain indexes to the name tables based on the hashed facility names. The AET File header 120 is updated with offsets to the name tables and hash tables so that the data can be recovered.

The process of analyzing AET data using the scoping tools requires access to the AET file, and an expansion of both the facility names as well as the time value names.

The scoping tools begin the process by opening the AET file. The header is read, and various arrays are allocated to store the qualifiers and names. An array pointer is set to point to each qualifier based on an index which will be obtained from the name table, and to point to the next qualifier of the name hierarchy for the name table.

Memory space is allocated for the hash table and name tables, and their contents are read from the offset contained in the header.

Once the foregoing AET file has been created during simulation, the file can be opened during a defining operation. A Get Facility routine may be invoked when the user of the scoping tool decides to observe trace events for a particular facility which are stored in the AET file. The Get Facility routine is illustrated more particularly in FIG. 6. The facility which is the basis of the inquiry is hashed to obtain an index in step 130. The offset to a collision chain is obtained from the hash table (see FIG. 8) based on the hash index in step 131. The collision chain extends until the next hash index value defines another collision chain.

As shown in FIG. 8, the collision chain 201 is looped through until all of the qualifiers in the facility has been verified in step 132. The first name table reveals the index to the qualifier index. The qualifier index in turn points to a hash value equal to the hashed value of the next qualifier in qualifier TABLES 203. The process continues until all qualifier indexes match the hashed values of the qualifiers identifying the name table as the correct one, or until a mismatch occurs. If the correct name table has been found it is stored as part of the name location in step 134, and the data list location for the facility is read in step 135. A pointer is passed to the simulation calling routine in step 136 identifying where in the storage structure location the facility data is to be found.

Figure 7:
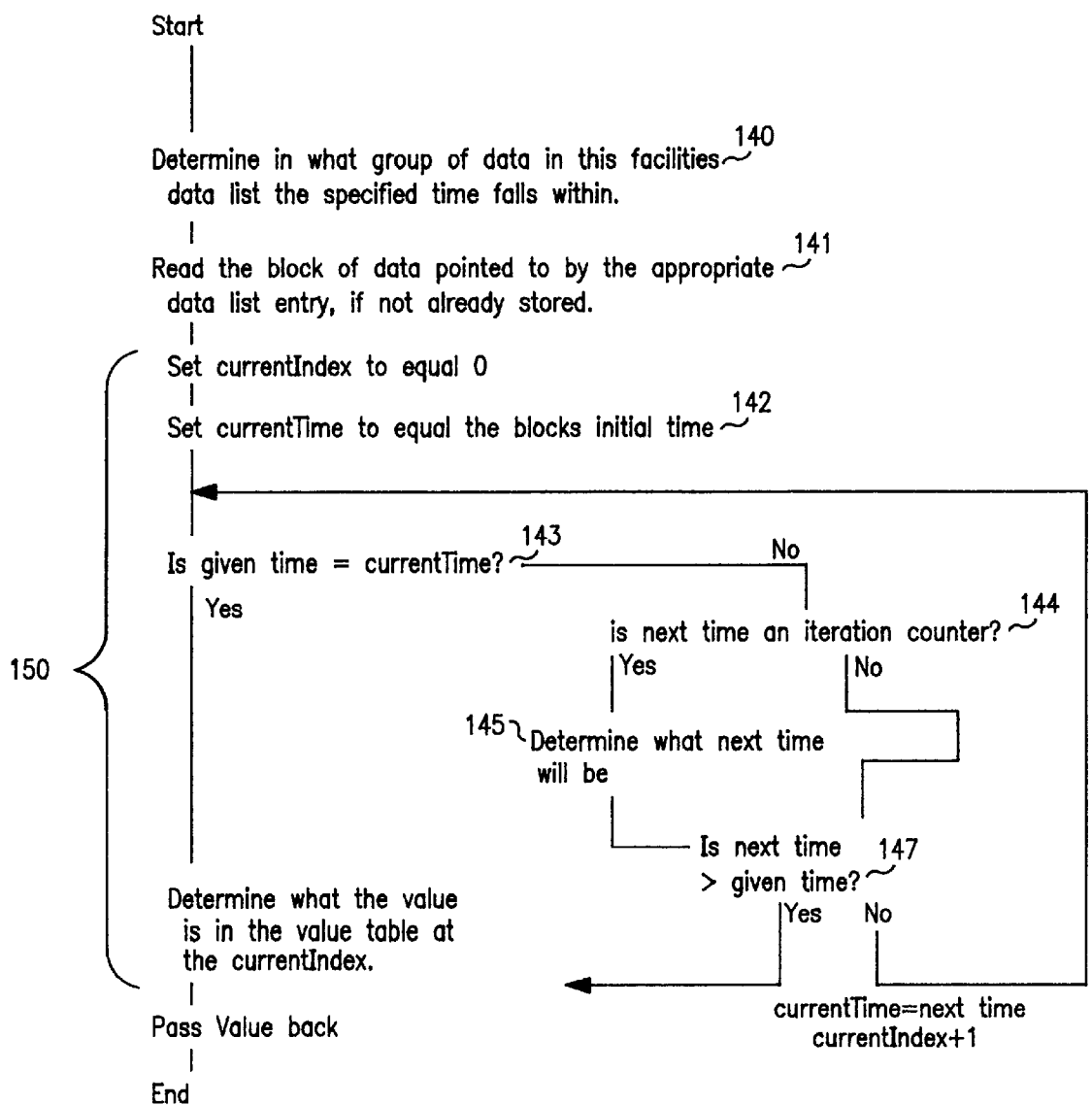
FIG. 7 illustrates the process for obtaining a stored facility value within the AET file.

The value for the facilities may then be obtained for any time interval over which the simulation was run. The process is shown in FIG. 7, where it is determined from the designer's inquiry the time at which a desired value occurred in step 140. The main offset 205 in the data list of FIG. 8 points to the block of time or deltas 209 in which the value is to be obtained. The block of data identified in the data list is read in step 141 for the appropriate time interval. Once the entry point for the block is obtained, the current time is set equal to the block's initial time in step 142.

From here, subroutine 150 goes through the block of time to locate the position of the value of interest. If the given time is equal to the first entry of the data as determined in step 143, then its time delta is known, and the corresponding value in the value array 210 of the same index represents the value of interest. Subroutine 150 is repeatedly executed until the time of interest is located.

In the event that the time of interest is not at the beginning of the identified block in step 144, the block is indexed to the next time interval within the block, and if this time corresponds to the time of interest, then the value for this index location is saved.

In the event that the next entry in the time block was an iteration count, step 145 determines what the next and subsequent times within the iteration count are. These are each compared with the time of interest, and when the time of interest is located in step 147, the value may be quickly located from the position of the time of interest within the iteration count. The obtained value is passed back to the user for observation.

Thus there is described a system for compressing the contents of an AET file so that both facility names and signal values versus time are provided in a compressed format which is easily expanded.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for compressing data produced in an all events trace file comprising:

creating time—value pairs of data identifying the value of a trace event and a time of occurrence of said trace event;

creating a first array of said time data representing the difference in time between a changes in values of said trace event, and creating a second array of said trace event values for each time in which said change in values occur;

compressing the contents of said first array comprising the steps of:

determining whether said first array contains any consecutive pairs of data which repeat;

each time said first array contains pairs of repeating data, replacing the second and subsequent pairs of said data with a value representing the number of times said time differences repeat in place of second and subsequent values of said pairs of repeating time differences;

compressing said second array of trace events comprising the steps of:

determining whether said second array contains any consecutive pairs of trace event data which forms a pattern; and replacing each second and subsequent pairs of trace event data with a value representing the number of times said differences repeat.

2. The method for compressing data according to claim 1 wherein said step of replacing said consecutive pairs of data replaces said pairs of trace events and time differences with an iteration count, the most significant bit of said iteration count indicating that the remaining bits of said iteration count represent the number of times a previous pair of values in an array are repeated.

3. The method for compressing data according to claim 1 further comprising:

compressing each facility name accompanying said values of trace event data.

4. The method according to claim 3 wherein said step of compressing said facility name comprises:

recursively applying said facility name to a hashing function to obtain a corresponding hashing value for each level of said facility name; and creating a hierarchial facility table which contains an entry for each level of said facility name and which includes an index value identifying the next higher level of said facility name.

5. The method according to claim 4 wherein said index identifying each level of said of facility name is contained in a hash table which correlates said index level with a hash value of a respective facility level.

6. The method according to claim 3 wherein said facility table includes a field which contains the lowest level qualifier for each level.

7. The method according to claim 6 wherein the highest level is identified as the highest field by an indicator contained in the field which contains the index level of the next higher level.

8. A method for creating a file of trace events produced during a circuit simulation comprising:

creating time—value pairs of data identifying the value of a trace event and a time of occurrence of said trace;

creating a first array of said time data representing the difference in time between a changes in values of said trace event, creating a second array of said trace event values for each time in which said change in value of said event occurs;

compressing the contents of said first array comprising the steps of:

determining whether said first array contains data which repeats to form a pattern;

each time said first array contains a set of repeating data, replacing the second and subsequent sets of said repeating data with a value representing the number of times said data repeats in place of second and subsequent values of said repeating data;

compressing said second array of trace event values comprising the steps of:

determining whether said second array contains any repetitive patterns of trace event data; and replacing each second and subsequent repetitive patterns of trace event data with a value representing the number of times said trace event pattern repeats; and storing said first and second arrays of data on a computer readable storage medium.

9. The method according to claim 8 wherein said repeating data constituting said pattern in said first and second arrays comprises first and second consecutive values of data.

* * * * *